United States Patent [19]
Farrar

[11] Patent Number: 6,017,829
[45] Date of Patent: Jan. 25, 2000

[54] IMPLANTED CONDUCTOR AND METHODS OF MAKING

[75] Inventor: Paul A. Farrar, South Burlington, Vt.

[73] Assignee: Micron Technology, Inc., Boise, Id.

[21] Appl. No.: 08/829,851

[22] Filed: Apr. 1, 1997

[51] Int. Cl.$^7$ .......................... H01L 21/31; H01L 21/469
[52] U.S. Cl. .............................................................. 438/783
[58] Field of Search ..................................... 438/783, 618

[56] References Cited

U.S. PATENT DOCUMENTS

| | | | |
|---|---|---|---|
| 4,088,799 | 5/1978 | Kurtin ........................................ | 427/38 |
| 4,906,591 | 3/1990 | Okumura ................................. | 437/189 |
| 5,232,863 | 8/1993 | Roberts .................................... | 437/40 |
| 5,317,197 | 5/1994 | Roberts .................................... | 257/401 |
| 5,726,805 | 3/1998 | Kaushik et al. ......................... | 359/589 |

FOREIGN PATENT DOCUMENTS 2-287594  6/1992  Japan .

*Primary Examiner*—Brian Dutton
*Attorney, Agent, or Firm*—Workman, Nydegger & Seeley

[57] ABSTRACT

The present invention is directed toward the formation of implanted thermally and electrically conductive structures in a dielectric. An electrically conductive structure, such as an interconnect, is formed through ion implantation into several levels within a dielectric layer to penetrate into an electrically conductive region beneath the dielectric layer, such as a semiconductor substrate. Ion implantation continues in discreet, overlapping implantations of the ions from the electrical conductive region up to the top of the dielectric layer so as to form a continuous interconnect. Structural qualities achieved by the method of the present invention include a low interconnect-conductive region resistivity and a low thermal-cycle stress between the interconnect and the dielectric layer in which the interconnect has been implanted. Implantation elements are selected in connection with dielectric materials so that heat treatment will cause continuous metallic structures to form within the interconnect implantation area. In an alternative embodiment, implantation dosages and depths are selected to form a thermally conductive structure that is entirely insulated within the dielectric layer and that function as a conduit to heat-sink structures.

77 Claims, 5 Drawing Sheets

IMPLANTED CONDUCTOR AND METHODS OF MAKING

BACKGROUND OF THE INVENTION

1. The Field of the Invention

The present invention comprises a conductor forming process in which ion implantation forms an electrically conductive interconnect within a dielectric layer. The inventive conductor forming process also uses implantation to form a thermally conductive structure that is insulated by and contained within the dielectric layer.

2. The Relevant Technology

In the microelectronics industry, a substrate refers to one or more semiconductor layers or structures which includes active or operable portions of semiconductor devices. A substrate assembly refers to a substrate with one or more layers or structures formed thereon. For example, a substrate assembly in the present disclosure can refer to a substrate with interconnects that connect to active areas within the substrate. The interconnects can be within an insulative layer upon the substrate assembly. A semiconductor device can refer to a substrate assembly upon which at least one microelectronic device has been or is being fabricated. The semiconductor device can also refer to a semiconductor substrate assembly having formed thereon elements such as transistors. Interconnection layers are formed on the semiconductor substrate assembly for electrically connecting such elements. The semiconductor industry has, since the development of the integrated circuit, used a process that required the etching of a hole or via in a dielectric layer and the subsequent filling of the hole with a conductive material to make a connection between one conductive layer and another. The connection was formed of such materials as polysilicon, high melting-point metals, high melting-point metal silicides, aluminum, and aluminum alloys. The ever-increasing pressure to miniaturize and to increase semiconductor device speed has required that both interconnect size and interconnect resistance be reduced. Therefore, semiconductor integrated circuit devices require interconnect structures of smaller lateral dimensions, and require materials that have smaller resistivities. A reliability problem in conventional etched via structures is over etching the via and undercutting a structure with which contact is to be made.

Because hole filling following an etch is problematic, interconnect hole filling seldom achieves a complete connection between the interconnect interface and the electrically conductive region beneath the interconnect. Attempts have been made to create interconnects by forming an interconnect first, followed by forming a dielectric layer, for example, by filling the regions between interconnects with a gelatinous material and curing the material into a solid dielectric. Thus, hole filling is avoided, however, there remains a discrete interface between the interconnect and the electrically conductive region that the interconnect contacts.

Additionally, as semiconductor device dimensions continue to shrink in size the problem of heat management continues to increase in complexity. As heat management requirements continue to increase, methods of removing heat from the semiconductor device without increasing the vertical or lateral geometries of the devices are constantly being sought.

What is needed is a method of forming an interconnect without the prior art via etching and via hole-filling process. What is also needed is a method of forming an interconnect wherein the interconnect minimizes interface discontinuities between the electrically-conductive region beneath the interconnect and the interconnect itself. What is also needed is a method of forming an interconnect that resists thermal cycle stresses at the interface with the dielectric material and with the electrically conductive region beneath the interconnect. What is also needed is a method of forming heat management structures within semiconductor devices without increasing the vertical or lateral geometries of the devices.

SUMMARY OF THE INVENTION

The present invention is directed toward the formation of an interconnect that is not within an etched via. Interconnect formation is accomplished through ion implantation into several levels within a dielectric layer. Ion implantation penetrates into an electrically conductive region beneath the dielectric layer and continues in discreet, overlapping implantations up to the top of the dielectric layer, thus forming a continuous interconnect.

Structural qualities achieved by the method of the present invention include a low resistivity between the interconnect and the conductive region. There is also a low thermal-cycle stress between the interconnect and the dielectric layer in which the interconnect has been implanted, and between the interconnect and the electrically conductive region beneath the interconnect.

Implantation elements may be selected in connection with dielectric materials so that heat treatment will cause continuous metallic structures to form within the interconnect implantation area by dissociation of metallic elements from the dielectric material and the combination of these dissociated elements with the implanted metal ions.

The present invention is also directed toward the implantation of ion dosages and depths that are selected so as to form heat-management structures that are entirely insulated within the dielectric layer. Heat-management structures of the present invention have coefficients of thermal conductivity that are greater than the coefficients of thermal conductivity of the preferred dielectric materials. Implantation can also simultaneously form semiconductor active areas with interconnect formation by the implantation methods of the present invention.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention is directed toward methods of forming an implanted interconnect and a structure for conducting thermal energy away from semiconductor devices. Disclosed is a method that does not require etching of a dielectric layer in the region that normally is removed in order to form a via, which is then filled with a conductive material to form the interconnect. Rather, the present method uses a succession of ion implants to produce an electrically or thermally conductive structure in sections of a dielectric layer where desired. The present invention is applicable to integrated semiconductor circuits, as well as in other applications where a connection is needed between two structures which will be separated by a dielectric layer.

Figure 1:
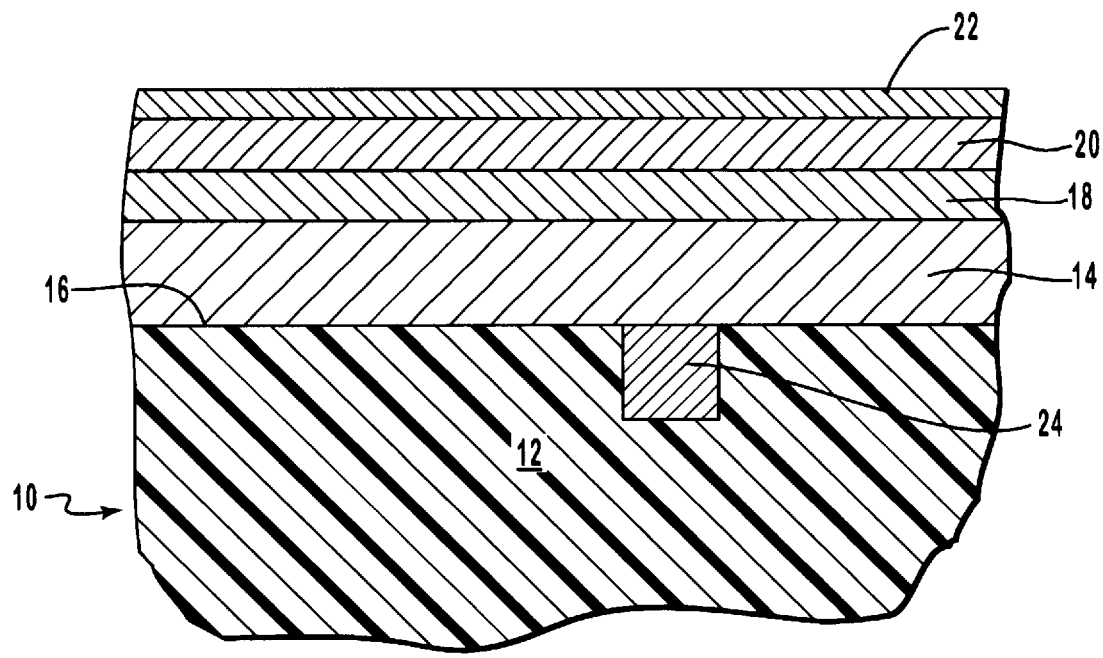
FIG. 1 is a cross-sectional elevation view illustrating a region of a semiconductor device into which conductive structures of the present invention are to be implanted.

FIG. 1 illustrates a first embodiment of the present invention in which a semiconductor device 10 comprising a substrate 12 has a dielectric layer 14 disposed upon an upper surface 16. Preferred materials for dielectric material 14 include commercial polyimides.

Examples of polyimides include pyromellitic dianhydride (PMDA) and oxydianiline (ODA, also named 4,4'-diaminodiphenyl ether). Other preferred polymers for use pursuant to the present invention are the polymers of benzophenonetetracarboxylic dianhydride (BTDA) and ODA and/or 1,3-phenylenediamine and the polymer of 3,3'-biphenylenetetracarboxylic acid (BPDA) and 1,4-phenylenediamine (PDA). Polyimide films based on PMDA-ODA are available from Allied Corporation under the tradename Apical® and from Du Pont under the tradename Kapton®. Films based on BPDA-PDA are available from Ube Corporation as Upilex® and from Hitachi Chemical Company as PIQ-L100. Other tradename polyimides useful pursuant to the present invention include Durimid® from Rogers Corporation and the Du Pont Pyralin® series, including PI-2525 and PI-2566. In combination, preferred dielectric polymers include BPDA-PDA, BPDA-ODA, BTDA-ODA, BTDA-PDA, PMDA-PDA, and PMDA-ODA.

Other perferred dielectrics include, borophosphosilicate glass (BPSG), borosilicate glass (BSG), phosphosilicate glass (PSG), silica, thoria, ceria, zirconia, and organometallic compounds.

First, second, and third mask layers 18, 20, 22 are disposed upon dielectric layer 14. An electrically conductive region 24 may be imbedded in upper surface 16 of substrate 12, or electrically conductive region 24 may be formed by the methods of the present invention. Region 24 can be a conductive line such as metallization formed of polysilicon, or it can be an active region substantially composed of doped silicon.

Figure 2:
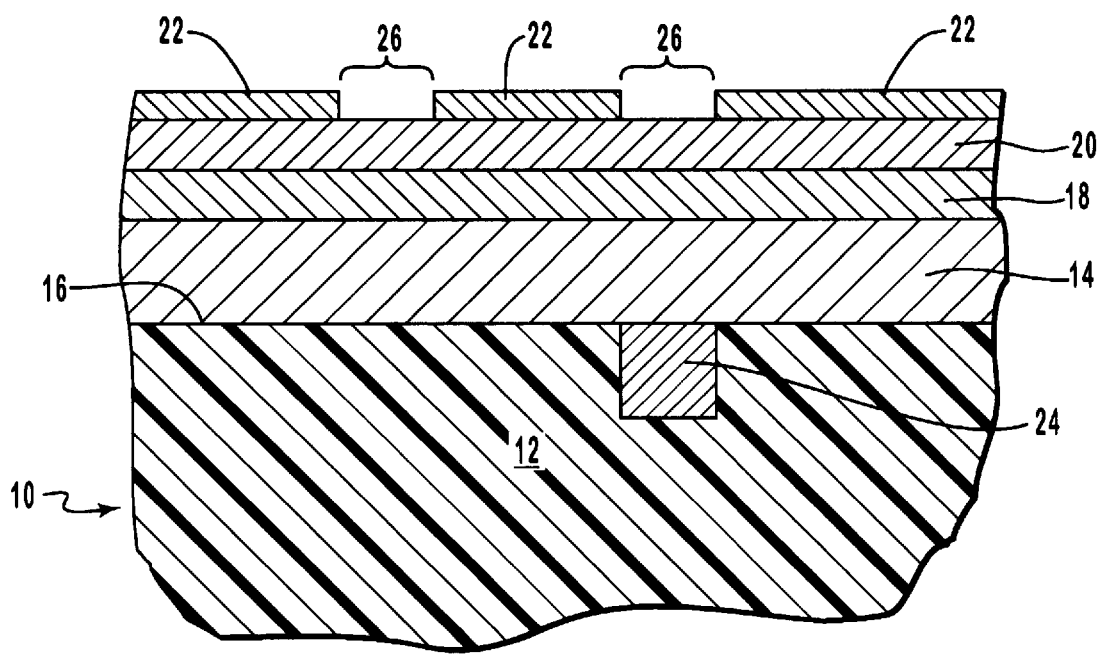
FIGS. 2, 3, and 4 are cross-sectional elevation views illustrating progressive process steps of forming the implanted conductive structures of the present invention.
Figure 3:
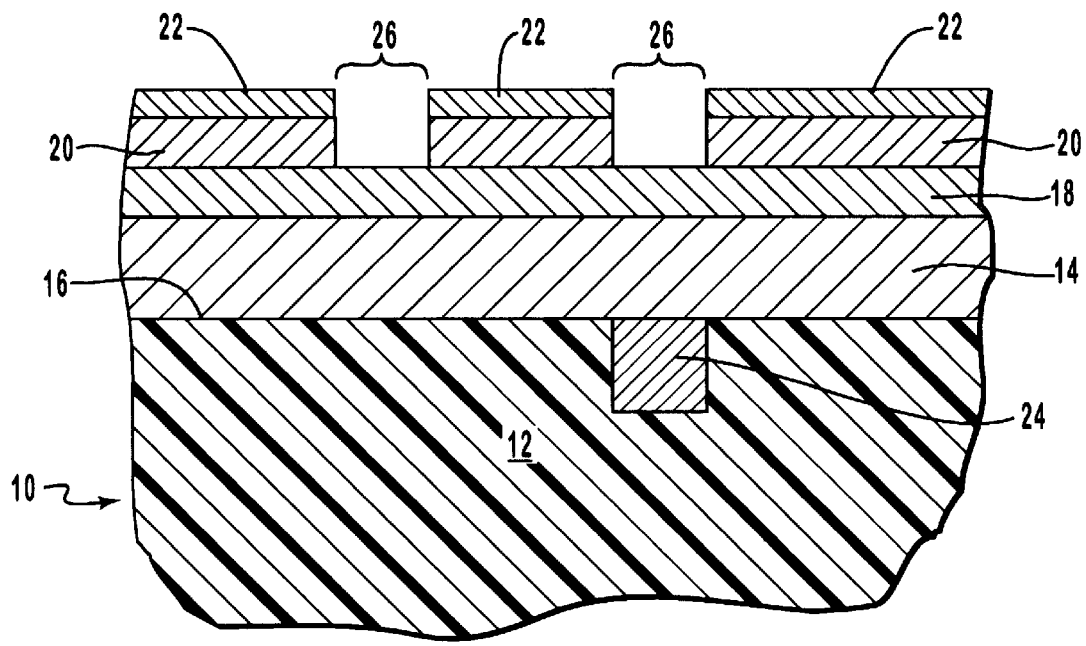
Figure 4:
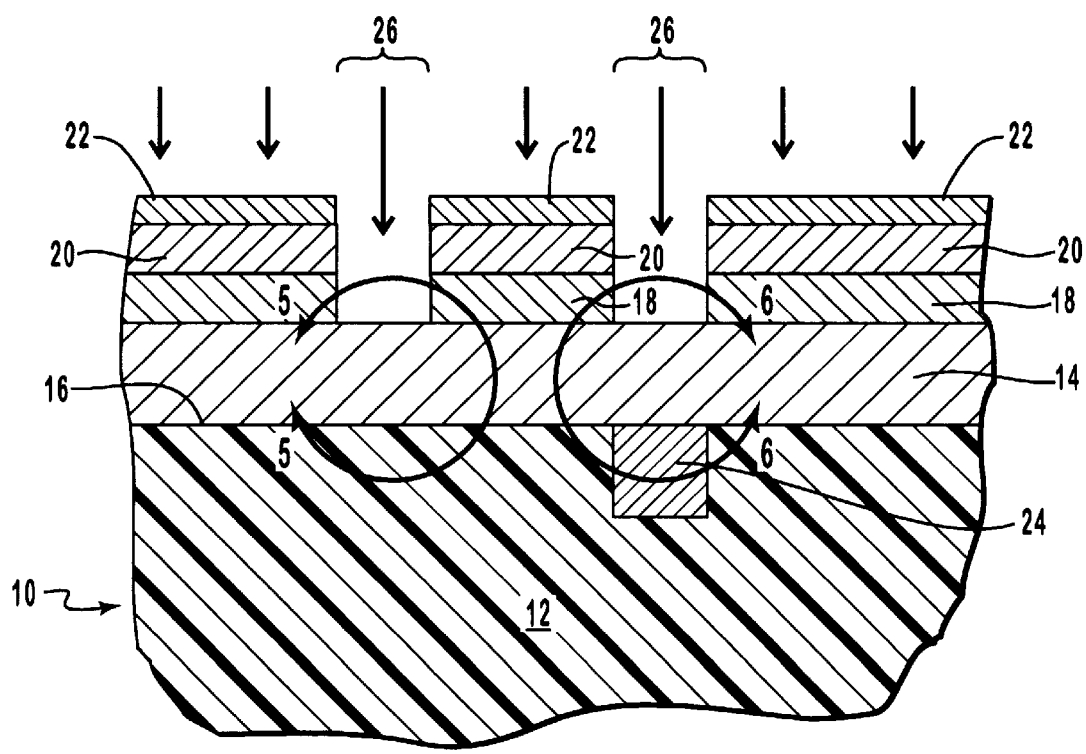

FIGS. 2, 3, and 4 progressively illustrate an example of the method of the present invention of etching through first, second, and third mask layers 18, 20, 22, and the ion implanting of electrically conductive material therethrough to form interconnects. In FIG. 2 an etch has been conducted in which etch holes 26 are formed in third mask layer 22. In FIG. 3 an etch continues to form etch holes 26 in second mask layer 20. In FIG. 4 an etch has formed an etch hole in first mask 18 layer.

Ion implantation is illustrated in FIG. 4 with downwardly vertical arrows. Ions implant within etch holes 26 into dielectric layer 14. Etch holes 26 may be, but need not be, above an electrically conductive region 24 within substrate 12. The step of ion implantation may serve as both a doping step in forming an electrically conductive region in substrate 12, and as an interconnect-forming implantation step of the present invention. In this simultaneous doping and interconnect-forming method alternative, an extra process step is avoided for active region doping. The advantage of the method is that it forms an electrically conductive region 24, a doped active area in this example, that is inherently aligned with the implanted interconnect.

Figure 5:
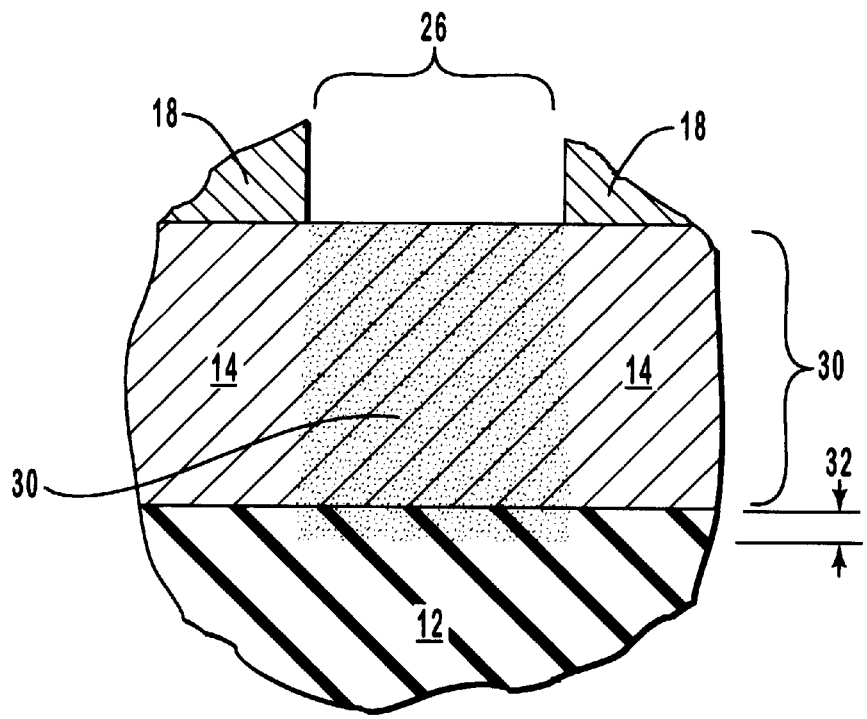
FIG. 5 is a cross-sectional elevation view taken along the 5—5 section line in FIG. 4, and, illustrates the result of ion-implantation wherein ions have been implanted within a dielectric layer with a portion of the implanted ions overlapping into an underlying substrate.

FIG. 5 illustrates the result of ion-implantation within the section-line in 5—5 in FIG. 4. In FIG. 5 an implanted interconnect 30 is illustrated wherein ions have been implanted within dielectric layer 14. A portion of implanted interconnect 30 overlaps into substrate 12. The overlap portion is an implanted overlap depth 32, that minimizes the electrical resistance interface and the thermal stress interface between interconnect 30 and electrically conductive region 24 if it is present. Preferably, implanted interconnect 30 will have a length in a range from about 1,000Å to about 30,000Å.

Formation of an active area simultaneously with formation of an interconnect makes the active area and the interconnect self-aligned. If substrate 12 is not doped, doping of substrate 12 can occur simultaneously with forming an interconnect in the region within and below etch hole 26. For example if substrate 12 is monocrystalline silicon, n-doping or p-doping can be performed by implanting selected ions. The ions that are implanted within substrate 12 will make that portion of substrate 12 into electrically conductive region 24. For example, aluminum ions produce n-doping in a monocrystalline silicon substrate, and subsequent aluminum ion implantation, or another selected metal ion, will form implanted interconnect 30.

Although substrate 12 is usually made of monocrystalline silicon, other substrates can be provided and doped simultaneously with formation of implanted interconnect 30. By way of example, semiconductors are fabricated from compounds made by a combination of elements from periodic table groups IA-VIIA, IIA-VIA, and IIIA-VA, as well as IA-IIA-VI$_2$A, and IIA-IVA-V$_2$.

Implanted overlap depth 32 expands laterally upon heat treatment of device 10 to form, for example, an active area in a transistor source-drain structure.

Dielectric layer 14 can be selected to be an organometallic dielectric or equivalent that releases metal elements in favor of bonding with oxygens or nitrogens and equivalents. Treatment is carried out in an oxygen or nitrogen atmosphere following implantation. Implantation of metal ions to form implanted interconnect 30 or an implanted thermal conductor will, either spontaneously or with heat treatment, cause the metals in the organometallic dielectric to combine with the implanted metal ions to form a substantially coherent and continuous metal interconnect.

Combination of the metals in the organometallic and the implanted species accomplishes more metallization in the implanted interconnect 30 or in an implanted thermal conductor than simple implantation alone achieves. Combination also renders the organometallic dielectric that remains more resistant to electrical conductivity than regions not implanted with metal ions.

An alternative to an organometallic dielectric that releases its metal element in favor of oxides or nitrides, is an organometallic that releases its metal element by catalysis caused by the presence of the implanted metal species. By this optional method, the regions of dielectric not implanted by the metal ions, do not become conductive at the temperatures at which the catalytic reaction occurs.

Figure 6:
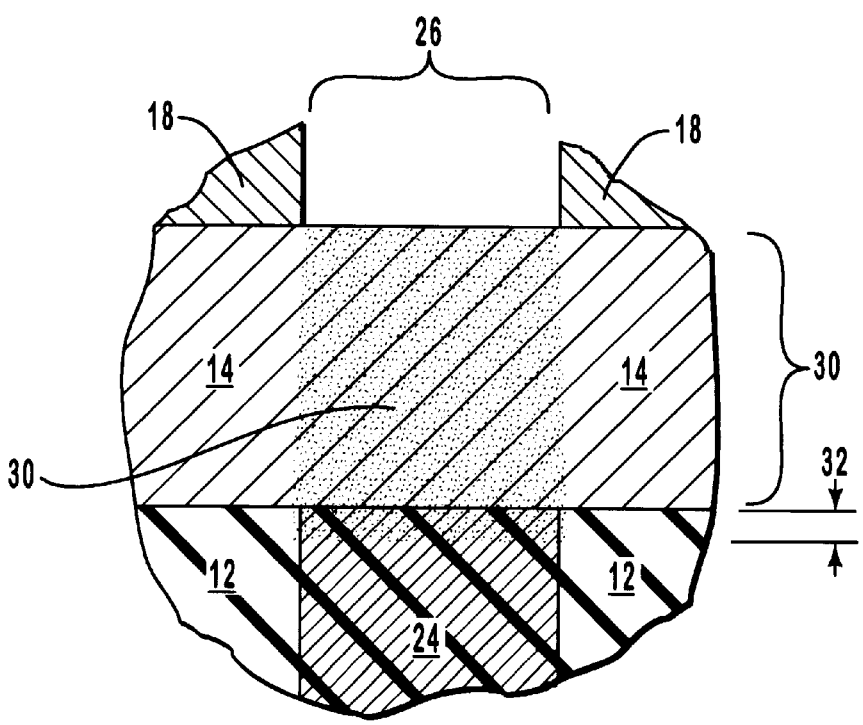
FIG. 6 is a cross-sectional elevation view taken along the 6—6 section line in FIG. 4, and illustrates ions having been implanted within the dielectric layer to contact an active area in the underlying substrate.

FIG. 6 illustrates electrically conductive region 24 that is imbedded within substrate 12. Ion implantation into dielectric layer 14 is illustrated as implanted interconnect 30, extending to implanted overlap depth 32. Overlap depth 32 can be optimized so as to minimize the electrical resistance interface and the thermal stress interface between interconnect 30 and electrically conductive region 24. Implanted overlap depth 32 and implanted interconnect 30 form a substantially continuous electrically conductive interface between substrate 12 and implanted interconnect 30. The advantage of a substantially continuous electrical interface between an interconnect and an electrically conductive region is that both resistivity and thermal stresses are ameliorated for field use of the semiconductor device.

Figure 7:
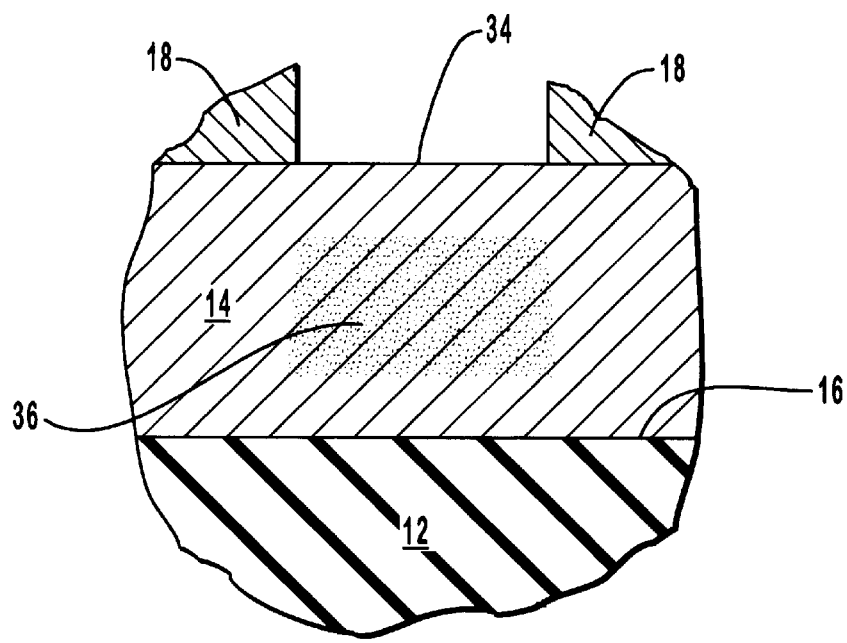
FIG. 7 is a cross-sectional elevation view taken along the 5—5 section line in FIG. 4, and illustrates ions having been implanted wholly within the dielectric layer.

FIG. 7 illustrates ion-implantation resulting in an implanted thermal conductor 36 that is formed entirely within dielectric layer 14. As such, there is no overlap into substrate 12, and no portion of the implanted contacts upper surface 34 of dielectric layer 14. Where no electrically conductive region 24 lies beneath etch hole 26, ion implantation may form a lateral interconnect to an implanted thermal conductor 30. Dielectric layer 14 continues to serve as an electrical insulator and implanted thermal conductor 36 serves as a thermal conductor where the coefficient of thermal conductivity of conductor 36 is greater than the coefficient of thermal conductivity of dielectric layer 14. Implanted thermal conductor 36 serves as a collector for Joule heat and a conduit for channeling heat therein, and acts as a heat sink.

Figure 8:
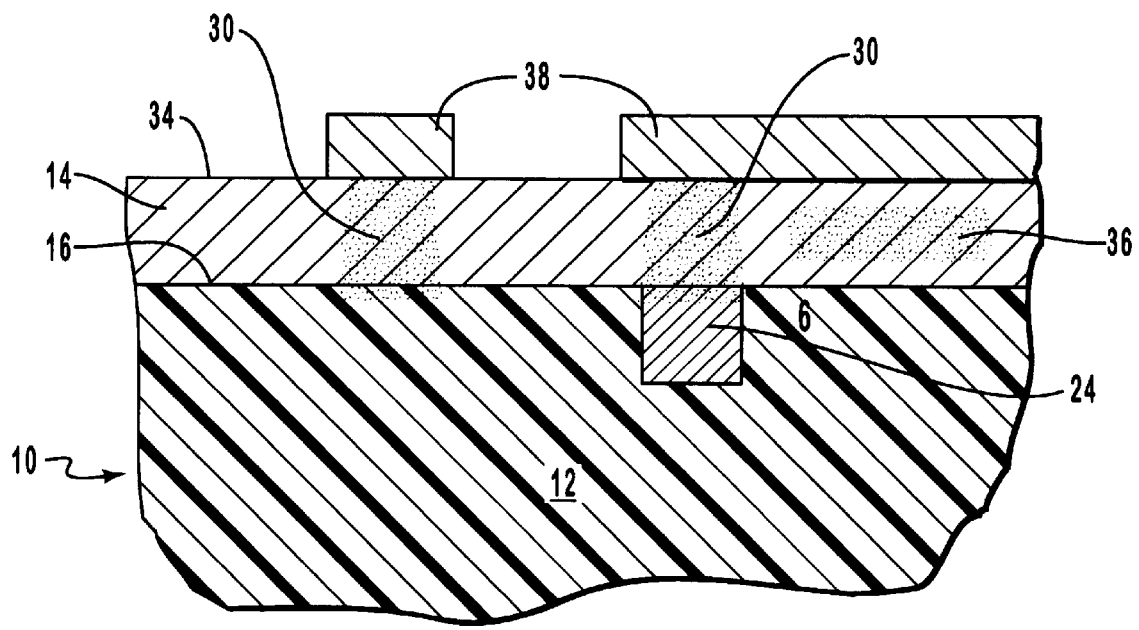
FIG. 8 is a cross-sectional elevation view illustrating embodiments of the conductive structures of the present invention which are seen FIGS. 5–7.

FIG. 8 is an illustration of semiconductor device 10 with three (3) features of the present invention illustrated therein. Two implanted interconnects 30 are illustrated wherein implantation has occurred in a first instance above electrically conductive region 24, and in a second instance above substrate 12 with no electrically conductive region thereunder. Implanted thermal conductor 36 is also illustrated in FIG. 8 wherein no electrical connection is made to substrate 12. Metallization lines 38 have been formed upon upper surface 34 of dielectric layer 14. Implanted interconnects 30 form interconnects from to metallization lines 38 to electrically conductive region 24 and to substrate 12. Implanted thermal conductor 36 lies beneath metallization lines 38 and serves as an excess Joule heat collector for metallization lines 38.

Prefered ions to form the implanted interconnect are chosen to be compatible with the structure in which it is used. In an integrated circuit, implantation of copper or gold in areas where these elements might migrate into the substrate could cause field failure and affect carrier lifetime. In other applications, copper or gold would be acceptable materials to use. In a semiconductor application, elements such as Al, Ni, Cr, Mo, Ta, W, Ti, Zr, Hf; or V and equivalents might be chosen. In some applications in which a preferred dielectric layer material is used, Ni would be a preferred element because of its resistance to oxidation and its relatively good electrical conductivity. In some applications in which a preferred dielectric layer material is used, Al would be a preferred element because it can be implanted into a dielectric that will not substantially oxidize it and because of aluminum's relatively good electrical conductivity.

Materials that will form the implanted interconnect or thermally conductive implants are selected so that when the total implant dose is integrated over any segment, the total amount of implant meets or exceeds the desired concentration. In an example of a 10,000Å film the first implant dose is selected so that at least 4 percent of the implant dose penetrates the entire 10,000Å film, and that at least 10 percent of the implant dose is deposited in the 500Å slice between 9,500Å and 10,000Å. The percentage of the implant dose is then calculated for each succeeding slice of 500Å in which any appreciable amount of the implant dose is absorbed. The dose of the implant is then calculated to produce a concentration that exceeds the desired minimum in the first slice. The percentage is then multiplied by the dose amount and divided by the nominal Si concentration of about $5 \times 10^{22}$ atoms/cm$^3$ to obtain the percent of the implanted species in each slice. The second and succeeding implants are determined in a like manner until an implanted interconnect or an implanted thermal conductor is formed as desired.

Figure 9:
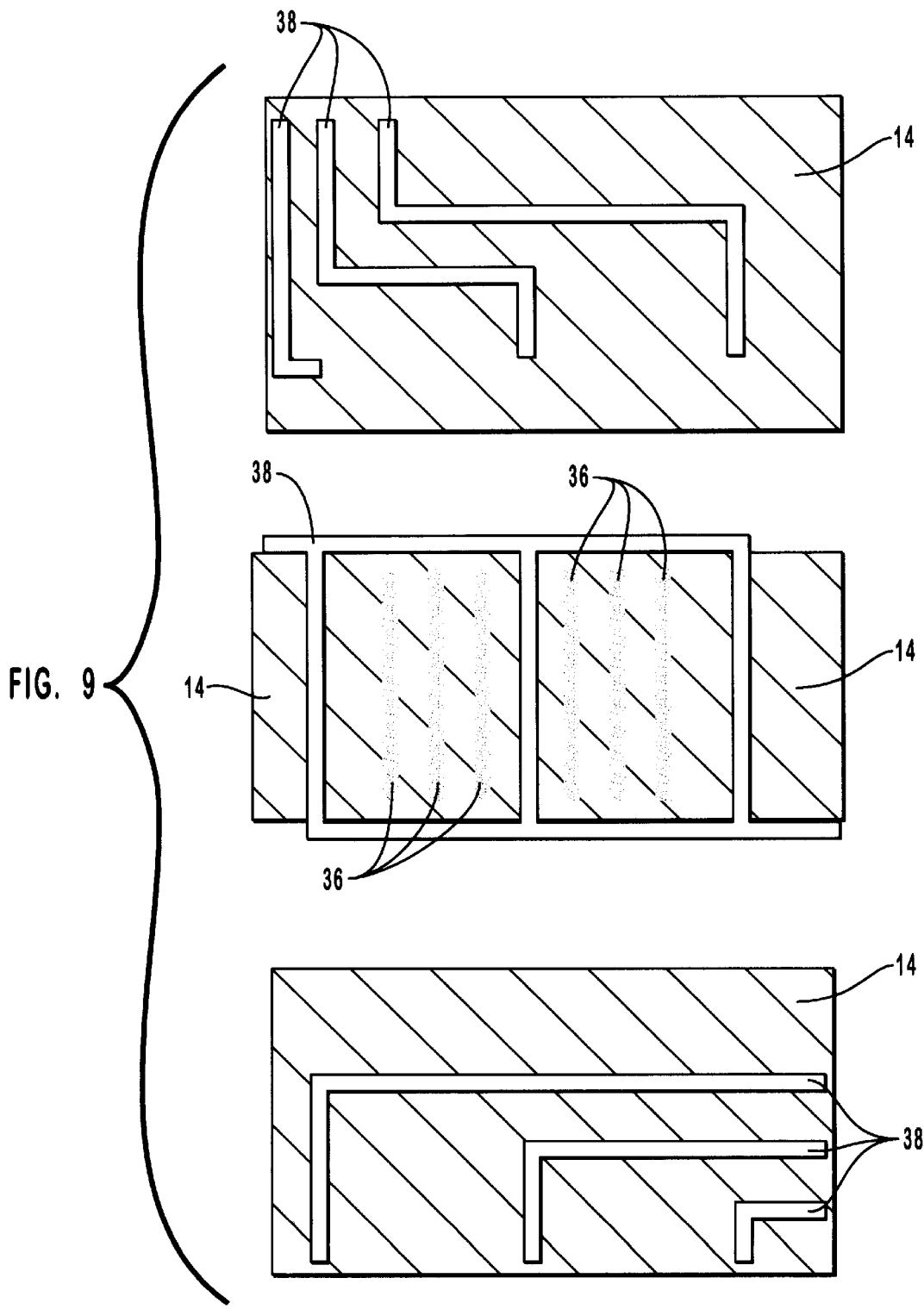
FIG. 9 shows top, cross-sectional, and bottom views of metallization lines upon a dielectric layer having therein implanted thermal conductors for thermally conducting heat away from the metallization lines according to the present invention.

FIG. 9 illustrates top, cross-sectional, and bottom views of metallization lines 38 and implanted thermal conductor 36. Implanted thermal conductor 36 is designed to conduct heat away from metallization lines 38 or away from another functional element within a semiconductor device that generates Joule heat during field operation. Implanted thermal conductor 36 is electrically isolated from metallization lines 38 by dielectric layer 14. Implanted thermal conductor 36 is situated proximal to metallization lines 38 such that heat generated in metallization lines 38 is conducted through dielectric layer 14 into implanted thermal conductor 36. Implanted thermal conductor 36 may serve, for example, as a channel that leads to a heat sink structure.

The implanted electrically conductive structure formed in the inventive process will have a width in a range from about 0.3Å to about 0.49Å, and the dielectric layer will have a thickness from about 2,000Å to about 12,000Å. More preferably, where the dielectric layer has a thickness range of from about 8,000Å to about 12,000Å, the implanted electrically conductive structure will have a width range of from about 0.39Å to about 0.49Å. Where the dielectric layer has a thickness range of from about 4,000Å to about 6,000Å, the implanted electrically conductive structure will have a width range of from about 0.33Å to about 0.43Å. Where the dielectric layer has a thickness range of from about 2,000Å to about 3,000Å, the implanted electrically conductive structure will have a width range of from about 0.30Å to about 0.40Å.

The following process is an example used to produce a no via-etch interconnect in a layer polyamide having a thickness of 10,000Å, which is seen in the Figures as dielectric layer 14. An appropriate mask is first put in place. This can be either a simple mask, a multiple-layer mask, or a stand-off mask covered by a thin metal or inorganic layer. The mask is then covered with an imaging resist layer. In any case, the mask must be thick enough to stop essentially all of the incoming implant species. The mask is then imaged to produce openings through which a series of implantations of the implant species are then performed.

If an electrical contact is desired, the energy of the implantation is chosen so that penetration of the implant species is substantially continuous through dielectric layer 14 to substrate 12. The energy of the implantation and the range of the depth of penetration of each implanted level can be calculated using, for example, a Monte Carlo simulation of the scatter and subsequent distribution of each of the required implant levels.

Calculations are given below in Table 1 for the formation of an implanted conductor in a dielectric layer having a thickness of about 10,000Å and being substantially composed of BPDA-ODA or PMDA-ODA. The implanted conductor is formed, as shown in the Figures, by applying first mask 18 as a 5,000Å thick positive photo resist. Second mask 20 is applied as a 5,000Å thick $Si_3N_4$ layer. Third mask 22 is applied as a 2,000Å top imaging photo resist. Masks 18, 20, 22 are exposed and patterned to form a mask that will facilitate ion implantation to form implanted interconnects 30. Implantation of Ni is then carried out. The remaining portions of masks 18, 20, and 22 serve to mask out unwanted ion implantation. Table 1 illustrates eight (8) implantation steps of this example embodiment.

TABLE 1

| Implant # | Implant Energy | Implant dose |
|---|---|---|
| 1 | 825 KEV | $1.35\ 10^{18}$ |
| 2 | 410 KEV | $8.98\ 10^{17}$ |
| 3 | 175 KEV | $3.2\ 10^{17}$ |
| 4 | 70 KEV | $1.3\ 10^{17}$ |
| 5 | 20 KEV | $7.0\ 10^{16}$ |
| 6 | 5 KEV | $1.6\ 10^{16}$ |
| 7 | 900 V | $1.3\ 10^{16}$ |
| 8 | 80 V | $4.0\ 10^{16}$ |

Illustration of the method of the present example continues by removing all masks and the metallizing the structure with appropriate electrically conductive materials such as is illustrated in FIG. 8 as metallization lines 38. Following connection of implanted interconnects 30 to metallization lines 38, additional layers may then be built upon the present structure, such as by depositing a second dielectric layer (not shown) and continuing to build up the device.

Implant dose and energy are a function of the qualities of both the dielectric layer and the implanted species. Variation of the type of material of the dielectric layer and the implanted species to achieve a desired structure are contemplated. Table 2 illustrates the result of a Ni implant in the inventive example.

TABLE 2

| Distance from Upper Surface of Dielectric Layer (Å) | Ni, Percent |
|---|---|
| 0–20 | 42 |
| 20–50 | 73 |
| 50–100 | 37 |
| 100–150 | 42 |
| 150–200 | 46 |
| 200–300 | 72 |
| 300–400 | 45 |

TABLE 2-continued

| Distance from Upper Surface of Dielectric Layer (Å) | Ni, Percent |
|---|---|
| 400–600 | 33 |
| 600–800 | 51 |
| 800–1000 | 47 |
| 1000–1250 | 33 |
| 1250–1500 | 44 |
| 1500–1750 | 53 |
| 1750–2000 | 56 |
| 2000–2500 | 43 |
| 2500–3000 | 33 |
| 3000–3500 | 38 |
| 3500–4000 | 86 |
| 4000–4500 | 95 |
| 4500–5000 | 66 |
| 5000–5500 | 36 |
| 5500–6000 | 41 |
| 6000–6500 | 31 |
| 6500–7000 | 40 |
| 7000–7500 | 48 |
| 7500–8000 | 67 |
| 8000–8500 | 86 |
| 8500–9000 | 68 |
| 9000–9500 | 49 |
| 9500–10000 | 66 |

As can be seen in Table 2, the minimum Ni concentration in any segment of 500Å or less is at least 31 percent. A preferred random distribution of metal atoms is a range from about 35 percent to about 40 percent metal provides enough electrically conductive material to give sufficient contact, whereas more than about four percent and less than about 10 percent is preferably in a segregated mixture. Depending upon the nature of the implant, some segregation will occur.

It may be desirable to anneal an implanted conductive structure to distribute the implanted species. Anneal conditions are chosen so that diffusion takes place in the implanted columns but no significant atom diffusion occurs between adjacent implanted areas. As implant damage occurs in areas of implantation, local diffusion rates in these areas will be enhanced.

In cases where an implanted conductive structure segregates during anneal into grain or sub-grain boundaries of the dielectric layer, a reduced amount of implant is required to give adequate electrical interconnect qualities. When the dielectric layer is a polymer, as in the above-given example, the heat treatment is preferably in a range from about 300 to about 500 degrees centigrade, and more preferably about 400 degrees centigrade. In the case of the above-given example, curing of the polyamide dielectric layer provides required heat for annealing of the implanted conductive structure.

Heat treatment following implantation can be beneficial. For instance, an implanted conductive structure with in a dielectric layer that overlaps into a semiconductor substrate will expand laterally upon heat treatment to form, for example, an active area associated with a transistor source-drain structure.

Dielectric layer 14, seen in the Figures, can be selected to be an organometallic dielectric or equivalent that releases metal elements in favor of bonding with oxygens or nitrogens and equivalents. Treatment is carried out in an oxygen or nitrogen atmosphere following implantation. Implantation of metal ions to form implanted interconnect 30 or an implanted thermal conductor will, either spontaneously or with heat treatment, cause the metals in the organometallic dielectric to combine with the implanted metal ions to form a substantially coherent and continuous metal interconnect.

Combination of the metals in the organometallic and the implanted species accomplishes more metallization in implanted interconnect 30 or in an implanted thermal conductor than simple implantation alone achieves. The combination also renders the organometallic dielectric more resistant to electrical conductivity than regions not implanted with metal ions.

The capabilities of a beam current implanter device being for used ion implantation will determine an optimized implant time. The thickness of the dielectric layer will also determine implant time. If the dielectric layer in the above-given example were 5,000 angstroms, the first implant would not be required and the total implant time would be 51 percent less than that required for a 10,000 angstrom dielectric layer. For a 2,500 angstrom dielectric layer, the first two implants would not be required and implant time would be reduced to 20 percent of implant time required for a 10,000 angstrom dielectric layer.

In the case of a 10,000 angstrom dielectric layer that is situated over an electrically conductive region, the minimum size contact which could be made is dependent upon the scatter of the ion implant species, and the size of the minimum photo-definable image. For example, if the minimum definable image were 0.25 microns with a tolerance of ±0.05 micron, the radial range of the most energetic implant would be added to the photolithographic tolerance to determine the appropriate minimum contact size. In the case of an implant of about 825 KeV, the minimum size would be approximately 0.14 microns, giving a total minimum contact size of approximately 0.44 microns. For a 4,500 angstrom film where maximum implant energy would be about 410 KeV, the radial range is approximately 0.075 microns, and results in a minimum effective contact size of about 0.38 micron. For a 2,500 angstrom film where maximum implant energy is about 175 KeV, the radial range is about 0.35 microns and results in a minimum contact size of about 0.34 microns.

The present invention may be embodied in other specific forms without departing from its spirit or essential characteristics. The described embodiments are to be considered in all respects only as illustrated and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by united states letters patent is:

1. A method of forming an electrically conductive structure comprising:
   forming a dielectric layer having a top surface upon a semiconductor substrate; and
   implanting metal ions into a portion of the dielectric layer, said implanted metal ions forming an electrically conductive structure within the dielectric layer that extends to the top surface of the dielectric layer.

2. The method as defined in claim 1, wherein said electrically conductive structure is also thermally conductive, said semiconductor substrate is not in electrical communication with said electrically conductive structure, and said electrically conductive structure is electrically isolated within said dielectric layer.

3. The method as defined in claim 2, wherein said electrically conductive structure has a higher coefficient of thermal conductivity than said dielectric layer.

4. The method as defined in claim 1, wherein said semiconductor substrate has a top surface and said electrically conductive structure extends from the top surface of said semiconductor substrate to the top surface of said dielectric layer.

5. The method as defined in claim 4, wherein said semiconductor substrate has an interface surface in contact with said dielectric layer, and wherein said metal ions are implanted beneath the interface surface, said metal ions being implanted into said semiconductor substrate such that said electrically conductive structure extends from the top surface of said dielectric layer to beneath said interface surface of said semiconductor substrate.

6. The method as defined in claim 4, wherein said metal ions are implanted into an electrically active area within said semiconductor substrate such that said electrically conductive structure extends from the top surface of said dielectric layer to said electrically active area within said semiconductor substrate.

7. The method as defined in claim 1, wherein implanting metal ions into a portion of the dielectric layer comprises:
   forming and patterning a mask layer on the dielectric layer to expose an area on said top surface of the dielectric layer and to leave unexposed another area on the top surface of said dielectric layer; and
   implanting said metal ions into said portion of said dielectric layer, said unexposed another area on the top surface of said dielectric layer being prevented from implantation by said metal ions by said layer of photoresist.

8. The method as defined in claim 7, further comprising forming an electrically conductive metal line on the top surface of the dielectric layer and in contact with the electrically conductive structure.

9. A method of forming an structure according to claim 7, wherein said mask layer comprises a three-layer composite comprising a first photoresist layer disposed upon said dielectric layer, a nitride layer disposed upon said first photoresist layer, and a second photoresist layer disposed upon said nitride layer.

10. A method of forming an structure according to claim 9, wherein said first photoresist layer is in a thickness range from about 2,000Å to about 8,000Å, said nitride layer is in a thickness range from about 2,000Å to about 8,000A, and said second photoresist layer in a thickness range from about 500Å to about 3,500Å.

11. A method of forming an structure according to claim 7, wherein said mask layer comprises a single mask layer.

12. A method of forming an structure according to claim 7, wherein said mask layer comprises a stand-off mask.

13. The method as defined in claims 1, wherein implanting metal ions into a portion of the dielectric layer comprises:
   applying a layer of photoresist to said top surface of the dielectric layer;
   patterning the layer of photoresist to expose an area on said top surface of the dielectric layer and to leave unexposed another area on the top surface of said dielectric layer; and
   implanting said metal ions into said exposed area on the top surface of the dielectric layer of said dielectric layer, said unexposed another area on the top surface of said dielectric layer being prevented from implantation by said metal ions by said layer of photoresist.

14. The method as defined in claims 13, wherein said electrically conductive structure extends from said semiconductor substrate to the top surface of said dielectric layer, said method further comprising:

stripping said photoresist layer from said top surface of said dielectric layer; and forming an electrically conductive metal line on the dielectric layer and in contact with the electrically conductive structure.

15. A method of forming an electrically conductive structure according to claim 1, wherein said dielectric layer is selected from a group consisting of BPSG, PSG, silica, thoria, ceria, and zirconia.

16. A method of forming an electrically conductive structure according to claim 1, wherein said dielectric layer is selected from a group consisting of organic, fluoro organic, and organometallic compounds.

17. A method of forming an electrically conductive structure according to claim 1, wherein said dielectric layer is selected from a group consisting of PMDA-ODA, BPDA-ODA, BPDA-PDA, PMDA-ODA, BTDA-PDA, and BTDA-ODA.

18. A method of forming an electrically conductive structure according to claim 1, wherein said dielectric layer is composed of a dielectric metal-containing compound that releases metallic elements from said metal-containing compound such that said implanted metal ions form metallic element release facilitators for said metallic elements and said dielectric metal-containing compound retains dielectric qualities.

19. A method of forming an electrically conductive structure according to claim 1, wherein said metal ions comprise at least one metal ion selected from the group consisting of Al, Ni, Cr, Mo, Ta, W, Ti, Zr, Hf; and V.

20. A method of forming an electrically conductive structure according to claim 1, wherein said metal ions comprises nickel.

21. A method of forming an electrically conductive structure according to claim 1, wherein said metal ions comprises aluminum.

22. A method of forming an electrically conductive structure according to claim 1, wherein implanting said metal ions into said portion of said dielectric layer comprises a series of implants of said metal ions to implant said metal ions in a series of overlapping implantation depths.

23. A method of forming an electrically conductive structure according to claim 22, wherein each of said series of implants of said metal ions comprises a concentration of the metal ions greater than about 30 percent of a region into which each of said series was implanted.

24. A method of forming an electrically conductive structure according to claim 22, wherein each of said series of overlapping implantation depths overlap in a range from about 0 percent to about 10 percent of the respective implantation dose both below and above each of said series of overlapping implantation depths.

25. A method of forming an electrically conductive structure according to claim 1, wherein a heat treatment is used to increase the electrical conductivity of the electrically conductive structure.

26. A method of forming an electrically conductive structure according to claim 25, wherein the heat treatment is carried out in the range between about 350° C. and 450° C. structure according to claim 1, wherein said metal ions comprises Ni ions, said dielectric layer is composed of PMDA-ODA or BPDA-ODA and has a thickness in a range from about 8,000Å to about 12,000Å, and said metal ions are implanted in a series of implantations.

27. A method of forming an electrically conductive structure according to claim , wherein said metal ions comprises Ni ions, said dielectric layer is composed of PMDA-ODA or BPDA-ODA and has a thickness in a range from about 8,000Å to about 12,000Å, and said metal ions are implanted in a series of implantations.

28. A method of forming an electrically conductive structure according to claim 1, further comprising heat treating said electrically conductive structure after implanting said metal ions.

29. A method of forming an electrically conductive structure according to claim 1, where said dielectric layer has a thickness range of from about 2,000Å to about 12,000Å, and wherein said electrically conductive structure has a width range of from about 0.3Å to about 0.49Å.

30. A method of forming an electrically conductive structure according to claim 1, where said dielectric layer has a thickness range of from about 8,000Å to about 12,000Å, and wherein said electrically conductive structure has a width range of from about 0.39Å to about 0.49Å.

31. A method of forming an electrically conductive structure according to claim 1, where said dielectric layer has a thickness range of from about 4,000Å to about 6,000Å, and wherein said electrically conductive structure has a width range of from about 0.33Å to about 0.43Å.

32. A method of forming an electrically conductive structure according to claim 1, where said dielectric layer has a thickness range of from about 2,000Å to about 3,000Å, and wherein said electrically conductive structure has a width range of from about 0.3Å to about 0.4Å.

33. A method of forming an electrically conductive structure according to claim 1, where said electrically conductive structure has a length in a range from about 1,000Å to about 30,000Å.

34. A method of forming an electrically and thermally conductive structure comprising:

forming a dielectric layer upon a semiconductor substrate; and implanting metal ions into the dielectric layer, wherein:

said implanted metal ions form an electrically and thermally conductive structure entirely within the dielectric layer that has a higher coefficient of thermal conductivity than said dielectric layer where not implanted, said semiconductor substrate is not in electrical communication with said electrically and thermally conductive structure, and said electrically and thermally conductive structure is electrically isolated within said dielectric layer.

35. The method as defined in claim 34, further comprising:

applying a layer of photoresist to a top surface of the dielectric layer; and patterning the layer of photoresist to expose an area on said the top surface of the dielectric layer and to leave unexposed another area on the top surface of said dielectric layer, wherein said unexposed another area on the top surface of said dielectric layer is unimplanted by said implantation of said metal ions due to said layer of photoresist.

36. The method as defined in claim 35, further comprising, after implanting metal ions:

stripping said photoresist layer from said top surface of said dielectric layer; and heat treating said electrically and thermally conductive structure.

37. A method of forming an electrically and thermally conductive structure according to claim 34, wherein said dielectric layer is composed of a dielectric metal-containing compound that releases metallic elements from said metal-containing compound such that said implanted metal ions form metallic element release facilitators for said metallic elements and said dielectric metal-containing compound retains dielectric qualities.

38. A method of forming an electrically and thermally conductive structure according to claim 34, wherein said metal ions comprise at least one metal ion selected from the group consisting of Al, Ni, Cr, Mo, Ta, W, Ti, Zr, Hf, and V.

39. A method of forming an electrically and thermally conductive structure according to claim 34, wherein implanting said metal ions into said exposed area on the top surface of said dielectric layer comprises a series of implants of said metal ions to implant said metal ions in a series of overlapping implantation depths.

40. A method of forming an electrically and thermally conductive structure according to claim 39, wherein each of said series of implants of said metal ions comprises a concentration of the metal ions greater than about 30 percent of a region into which each of said series was implanted.

41. A method of forming an electrically conductive structure comprising:
   forming a dielectric layer in contact with an interface surface of a semiconductor substrate having a top surface, said dielectric layer having a top surface; and
   implanting metal ions into the dielectric layer and beneath the interface surface into said semiconductor substrate, said implanted metal ions forming an electrically conductive structure, said electrically conductive structure extending from within said semiconductor substrate to the top surface of said dielectric layer.

42. The method as defined in claim 41, wherein said metal ions are implanted into an electrically active area within said semiconductor substrate such that said electrically conductive structure extends from the top surface of said dielectric layer to said electrically active area within said semiconductor substrate.

43. The method as defined in claim 41, further comprising:
   applying a layer of photoresist to the top surface of the dielectric layer; and
   patterning the layer of photoresist to expose an area on said top surface of the dielectric layer and to leave unexposed another area on the top surface of said dielectric layer, wherein said unexposed another area on the top surface of said dielectric layer is unimplanted by said implantation of said metal ions due to said layer of photoresist.

44. The method as defined in claim 43, further comprising, after implanting metal ions:
   stripping said photoresist layer from said top surface of said dielectric layer;
   heat treating said electrically conductive structure; and
   forming an electrically conductive metal line on the top surface of said dielectric layer and in contact with the electrically conductive structure.

45. The method as defined in claim 41, wherein said dielectric layer is composed of a dielectric metal-containing compound that releases metallic elements from said metal-containing compound upon the heating thereof such that said implanted metal ions form metallic element release facilitators for said metallic elements and said dielectric metal-containing compound retains dielectric qualities.

46. The method as defined in claim 41, wherein said metal ions comprise at least one metal ion selected from the group consisting of Al, Ni, Cr, Mo, Ta, W, Ti, Zr, Hf, and V.

47. The method as defined in claim 41, wherein implanting said metal ions into said portion of said dielectric layer comprises a series of implants of said metal ions to implant said metal ions in a series of overlapping implantation depths.

48. The method as defined in claim 47, wherein each of said series of implants of said metal ions comprises a concentration of the metal ions greater than about 30 percent of a region into which each of said series was implanted.

49. A method of forming an electrically conductive structure comprising:
   forming a dielectric layer in contact with an interface surface of a semiconductor substrate having a top surface and an electrically active area therein, said dielectric layer having a top surface; and
   implanting metal ions into the dielectric layer, beneath the interface surface, and into said electrically active area within said semiconductor substrate, said implanted metal ions forming an electrically conductive structure extending from said electrically active area within said semiconductor substrate to the top surface of said dielectric layer.

50. The method as defined in claim 49, further comprising:
   applying a layer of photoresist to the top surface of the dielectric layer; and
   patterning the layer of photoresist to expose an area on said top surface of the dielectric layer and to leave unexposed another area on the top surface of said dielectric layer, wherein said unexposed another area on the top surface of said dielectric layer is unimplanted by said implantation of said metal ions due to said layer of photoresist.

51. The method as defined in claim 49, further comprising, after implanting metal ions:
   stripping said photoresist layer from said top surface of said dielectric layer;
   heat treating said electrically conductive structure; and
   forming an electrically conductive metal line on the top surface of said dielectric layer and in contact with the electrically conductive structure.

52. The method as defined in claim 49, wherein said dielectric layer is composed of a dielectric metal-containing compound that releases metallic elements from said metal-containing compound upon the heating thereof such that said implanted metal ions form metallic element release facilitators for said metallic elements and said dielectric metal-containing compound retains dielectric qualities.

53. The method as defined in claim 49, wherein said metal ions comprise at least one metal ion selected from the group consisting of Al, Ni, Cr, Mo, Ta, W, Ti, Zr, Hf, and V.

54. The method as defined in claim 49, wherein implanting said metal ions into said portion of said dielectric layer comprises a series of implants of said metal ions to implant said metal ions in a series of overlapping implantation depths.

55. The method as defined in claim 54, wherein each of said series of implants of said metal ions comprises a concentration of the metal ions greater than about 30 percent of a region into which each of said series was implanted.

56. A method of forming an electrically conductive structure comprising:
   forming a dielectric layer having a top surface upon a semiconductor substrate, said dielectric layer being composed of a dielectric metal-containing compound that releases metallic elements from said metal-containing compound upon the heating thereof such that said implanted metal ions form metallic element release facilitators for said metallic elements and said dielectric metal-containing compound retains dielectric qualities;

applying a layer of photoresist to the top surface of the dielectric layer;

patterning the layer of photoresist to expose a portion of the dielectric layer and to leave unexposed another portion of said dielectric layer;

implanting said metal ions into said portion of said dielectric layer, said implanted metal ions forming an electrically conductive structure, said unexposed another portion of said dielectric layer being prevented from implantation by said metal ions by said layer of photoresist, wherein implanting said metal ions into said portion of said dielectric layer comprises:

a series of implants of said metal ions to implant said metal ions in a series of overlapping implantation depths, each of said series of implants of said metal ions comprises a concentration of the metal ions greater than about 30 percent of a region into which each of said series was implanted;

stripping said photoresist layer from said top surface of said dielectric layer;

heat treating said electrically conductive structure; and forming an electrically conductive metal line on the dielectric layer and in contact with the electrically conductive structure.

57. The method as defined in claim 56, wherein said electrically conductive structure is thermally conductive and has a higher coefficient of thermal conductivity than said dielectric layer, said semiconductor substrate is not in electrical communication with said electrically conductive structure, and said electrically conductive structure is electrically isolated within said dielectric layer.

58. The method as defined in claim 56, wherein said semiconductor substrate has a top surface and said electrically conductive structure extends from said semiconductor substrate to the top surface of said dielectric layer.

59. The method as defined in claim 56, wherein said semiconductor substrate has an interface surface in contact with said dielectric layer, and wherein said metal ions are implanted beneath the interface surface, said metal ions being implanted into said semiconductor substrate such that said electrically conductive structure extends from the top surface of said dielectric layer to beneath said interface surface of said semiconductor substrate.

60. The method as defined in claim 56, wherein said metal ions are implanted into an electrically active area within said semiconductor substrate such that said electrically conductive structure extends from the top surface of said dielectric layer to said electrically active area within said semiconductor substrate.

61. A method of altering the electrical conductivity of a dielectric material, the method comprising:

forming a dielectric material having a top surface upon a semiconductor substrate; and implanting ions through an exposed area on the top surface and into a portion of the dielectric material to change said portion from being electrically insulative to being electrically conductive, wherein said portion is within the dielectric layer and extends to the exposed area on the top surface of the dielectric layer.

62. A method of altering the electrical and thermal conductivity of a dielectric material, the method comprising:

forming a dielectric material having a top surface upon a semiconductor substrate; and implanting ions through an exposed area on the top surface and into a portion of the dielectric material to change said portion:

from being electrically insulative to being electrically conductive; and to have a higher coefficient of thermal conductivity, wherein said portion is within the dielectric layer and extends to the exposed area on the top surface of the dielectric layer.

63. The method as defined in claim 62, wherein the portion:

is not in electrical communication with the semiconductor substrate; and is electrically isolated within said dielectric layer.

64. A method of altering the electrical conductivity of a dielectric material, the method comprising:

forming a dielectric material in contact with an interface surface of a semiconductor substrate having a top surface, said dielectric layer having a top surface; and implanting ions through an exposed area on the top surface of the dielectric layer and into a portion of the dielectric material and beneath the interface surface into said semiconductor substrate, whereby said portion:

is changed from being electrically insulative to being electrically conductive; and extends from within said semiconductor substrate to the top surface of said dielectric layer.

65. A method of altering the electrical conductivity of a dielectric material, the method comprising:

forming a dielectric material in contact with an interface surface of a semiconductor substrate having a top surface and an electrically active area therein, said dielectric layer having a top surface; and implanting ions through an exposed area on the top surface of the dielectric layer and into a portion of the dielectric material, beneath the interface surface, and into said electrically active area within said semiconductor substrate into said semiconductor substrate, whereby said portion:

is changed from being electrically insulative to being electrically conductive: and extends from said electrically active area within said semiconductor substrate to the top surface of said dielectric layer.

66. A method of altering the electrical conductivity of a dielectric material and situated upon a semiconductor substrate, the method comprising:

applying a layer of photoresist to a top surface of the dielectric material:

patterning the layer of photoresist to expose a portion of the dielectric material and to leave unexposed another portion of the dielectric material;

implanting ions into said portion of said dielectric material, wherein said exposed portion is changed from being electrically insulative to being electrically conductive, said unexposed another portion of said dielectric material being prevented from implantation by said layer of photoresist, wherein implanting said ions comprises a series of implants of said ions in a series of overlapping implantation depths, each said implantation depth having a concentration of said ions that is greater than about 30 percent of the region into said ions were implanted;

stripping said photoresist layer from said top surface of said dielectric layer;

heat treating said dielectric material to release metallic elements from a dielectric metal-containing compound of said dielectric material, and such that said ions form metallic element release facilitators for said metallic elements and said dielectric metal-containing compound to retain dielectric qualities; and forming an electrically conductive metal line on the dielectric material that is in contact with the exposed portion that is implanted with said ions.

67. The method as defined in claim 66, wherein:

said exposed portion that was implanted with the ions has a higher coefficient of thermal conductivity than said the unexposed other portion of dielectric layer;

said semiconductor substrate is not in electrical communication with said exposed portion that was implanted with the ions; and said exposed portion that was implanted with the ions is electrically isolated within said dielectric layer.

68. The method as defined in claim 66, wherein:

said exposed portion that was implanted with the ions has an interface surface in contact with said dielectric layer;

said ions are implanted beneath the interface surface;

said ions are implanted into said semiconductor substrate such that said exposed portion that was implanted with the ions extends from the top surface of said dielectric layer to beneath said interface surface of said semiconductor substrate.

69. The method as defined in claim 66, wherein said ions are implanted into an electrically active area within said semiconductor substrate such that said exposed portion that was implanted with the ions extends from the top surface of said dielectric layer to said electrically active area within said semiconductor substrate.

70. The method as defined in claim 66, wherein:

said dielectric layer is composed of a material selected from a group consisting of:
  BPSG, PSG, silica, thoria, ceria, and zirconia;
  organic, fluoro organic, and organometallic compounds;
  PMDA-ODA, BPDA-ODA, BPDA-PDA, PMDA-ODA, BTDA-PDA, and BTDA-ODA;
  said ions comprise at least one metal ion selected from the group consisting of:
    Al, Ni, Cr, Mo, Ta, W, Ti, Zr, Hf, and V.

71. A method of forming an electrically conductive structure comprising:

forming a dielectric layer upon a semiconductor substrate; and implanting metal ions into a portion of the dielectric layer, said implanted metal ions forming an electrically conductive structure in said position, wherein implanting said metal ions into said portion of said dielectric layer comprises a series of implants of said metal ions to implant said metal ions in a series of overlapping implantation depths.

72. A method of forming an electrically conductive structure according to claim 71, wherein each of said series of implants of said metal ions comprises a concentration of the metal ions greater than about 30 percent of a region into which each of said series was implanted.

73. A method of forming an electrically conductive structure according to claim 71, wherein each of said series of overlapping implantation depths overlap in a range from rout 0 percent to about 10 percent of the respective implantation dose both below and above each of said series of overlapping implantation depths.

74. A method of forming an electrically and thermally conductive structure comprising:

forming a dielectric layer upon a semiconductor substrate; and implanting metal ions into a portion of the dielectric layer, said implanted metal ions forming an electrically and thermally conductive structure having a higher coefficient of thermal conductivity than said dielectric layer where not implanted, said semiconductor substrate not being in electrical communication with said electrically and thermally conductive structure, and said electrically and thermally conductive structure being electrically isolated within said dielectric layer, wherein implanting said metal ions into said portion of said dielectric layer comprises a series of implants of said metal ions to implant said metal ions in a series of overlapping implantation depths.

75. A method of forming an electrically and thermally conductive structure according to claim 74, wherein each of said series of implants of said metal ions comprises a concentration of the metal ions greater than about 30 percent of a region into which each of said serif was implanted.

76. A method of forming an electrically conductive structure comprising:

forming a dielectric layer in contact with an interface surface of a semiconductor substrate having a top surface and an electrically active area therein, said dielectric layer having a top surface; and implanting metal ions into a portion of the dielectric layer, beneath the interface surface, and into said electrically active area within said semiconductor substrate, said implanted metal ions forming an electrically conductive structure extending from said electrically active area within said semiconductor substrate to the top surface of said dielectric layer, wherein implanting said metal ions into said portion of said dielectric layer comprises a series of implants of said metal ions to implant said metal ions in a series of overlapping implantation depths.

77. The method as defined in claim 76, wherein each of said series of implants of said metal ions comprises a concentration of the metal ions greater than about 30 percent of a region into which each of said series was implanted.

* * * * *

UNITED STATES PATENT AND TRADEMARK OFFICE
CERTIFICATE OF CORRECTION

PATENT NO. : 6,017,829
DATED : Jan. 25, 2000
INVENTOR(S) : Paul A. Farrar

It is certified that error appears in the above-identified patent and that said Letters Patent are hereby corrected as shown below:

Col. 1, line 29, after "elements." insert a paragraph break

Col. 3, line 14, after "seen" insert --in--

Col. 5, line 42, after "conductor" change "30" to --36--

Col. 5, line 60, after "from" delete "to"

Col. 6, line 5, change "Hf;" to --Hf,--

Col. 6, line 42, after "layer" change "14" to --14--

Col. 8, line 53, after "structure" change "with in" to --within--

Col. 9, line 9, change "for used" to --used for--

Col. 10, lines 33, 39, 45, and 47, change "an" to --a--

Col. 11, line 32, change "comprises" to --comprise--

Col. 11, line 35, change "comprises" to --comprise--

Col. 11, line 61, change "comprises" to --comprise--

Col. 11, line 66, after "claim" insert --1--

UNITED STATES PATENT AND TRADEMARK OFFICE
CERTIFICATE OF CORRECTION

PATENT NO. : 6,017,829
DATED : Jan. 25, 2000
INVENTOR(S) : Paul A. Farrar

It is certified that error appears in the above-identified patent and that said Letters Patent are hereby corrected as shown below:

Col. 16, line 64, after "about" change "30" to --30--

Col. 18, line 9, change "rout" to --about--

Col. 18, line 34, change "serif" to --series--

Signed and Sealed this

Third Day of April, 2001

*Attest:*

NICHOLAS P. GODICI

*Attesting Officer*     *Acting Director of the United States Patent and Trademark Office*